(12) United States Patent
Yang

(10) Patent No.: US 7,253,648 B2
(45) Date of Patent: *Aug. 7, 2007

(54) SIGNAL ACQUISITION PROBE HAVING A RETRACTABLE DOUBLE CUSHIONED PROBING TIP WITH EOS/ESD PROTECTION CAPABILITIES

(75) Inventor: Kei-Wean C. Yang, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/139,111

(22) Filed: May 27, 2005

(65) Prior Publication Data

US 2006/0267603 A1    Nov. 30, 2006

(51) Int. Cl.
G01R 31/26 (2006.01)

(52) U.S. Cl. ...................................... 324/754

(58) Field of Classification Search ........ 324/754–762, 324/72.5, 133, 158.1; 439/480, 482, 578, 439/585
See application file for complete search history.

(56) References Cited

U.S. PATENT DOCUMENTS

| 4,673,839 | A | * | 6/1987 | Veenendaal ................. 310/338 |
| 4,721,903 | A | | 1/1988 | Harsch et al. |
| 6,704,670 | B2 | | 3/2004 | McTigue |
| 6,734,689 | B1 | * | 5/2004 | Yang .......................... 324/754 |
| 7,017,435 | B2 | * | 3/2006 | Pooley et al. .............. 73/866.5 |
| 7,126,360 | B1 | * | 10/2006 | Yang .......................... 324/754 |

* cited by examiner

*Primary Examiner*—Vinh P. Nguyen
(74) *Attorney, Agent, or Firm*—William K. Bucher

(57) ABSTRACT

A measurement probe has a spring loaded probe assembly and a pressure sensor disposed in a housing. The pressure sensor forms an electrical switch for passing an activation signal to a EOS/ESD protection module in response to axial movement of the housing relative to the probe assembly. A first compressive element produces a first pre-loaded compressive force and an increasing compressive force on the probe assembly and a second compressive element produces a second pre-loaded compressive force and an increasing compressive force on the probe assembly subsequent to the first increasing compressive force.

30 Claims, 10 Drawing Sheets

SIGNAL ACQUISITION PROBE HAVING A RETRACTABLE DOUBLE CUSHIONED PROBING TIP WITH EOS/ESD PROTECTION CAPABILITIES

BACKGROUND OF THE INVENTION

The present invention relates generally to signal acquisition probes and more particularly to a signal acquisition probe having a retractable double cushioned probing tip and electrical over stress (EOS) and electrostatic discharge (ESD) protection capabilities.

Ultra high speed sampling heads used in time domain reflectometry typically dictate extremely low capacitances. This introduces unique problems. Sampling devices are much more sensitive to static discharge residing on a device under test. The small geometry of the sampling diodes in the sampling head often dictate low breakdown voltages. The low parasitic capacitance at the sampling head input means that for a given device under test (DUT) static discharge, there will be a higher transient voltage at the sampler input because of the reduced charge sharing effect. It is therefore important to neutralize any static charge on the device under test before the sampling head input is coupled to the device under test.

U.S. Pat. No. 6,734,689 describes a measurement probe providing signal control for an EOS/ESD protection control module. The measurement probe has a spring loaded coaxial probe assembly and a pressure sensor that work in combination to provide an activation signal to the control module. The spring loaded coaxial cable assembly and pressure sensor are disposed in a probe housing. The spring loaded coaxial probe assembly has a semi-rigid coaxial cable with one end forming a probing tip and the other end having a threaded connector. A flexible coaxial cable is connected to the threaded connector and to the control module. A compression spring is positioned over the semi-rigid coaxial cable with one end secured to the semi-rigid coaxial cable and the other end engaging the probe housing. The compression spring is pre-loaded to apply an initial force to the spring loaded coaxial probe assembly as shown graphically in FIG. 1. FIG. 1 shows the forces applied to the probing tip of the spring loaded coaxial probe assembly during use where "F" is the force applied to the probing tip, $k_1$ is the spring constant, and $\Delta X$ is the displacement of the spring from its equilibrium position. The pre-loading of the compression spring generates an initial force $F_1$ on the coaxial probe assembly. The pressure sensor has one electrical contact attached to the outer shielding conductor of the semi-rigid coaxial cable which is connected to electrical ground via the flexible coaxial cable. The other pressure sensor electrical contact is mounted to the probe housing. An electrical conductor electrically couples the pressure sensor to the control module.

The control modules provides a ground circuit path for the signal conductor of the measurement probe when the activation signal is absent. When the probing tip makes contact with the device under test, any static electricity on the DUT is coupled via the signal conductor to ground via the control module. As downward pressure is applied to probe housing, the coaxial probe assembly retracts into the probe body. The compression spring exerts increasing pressure on the coaxial probe assembly following Hook's Law of $F=k_1 \Delta X$ where $k_1$ is the spring constant. Continued downward pressure applied to the probe housing results in the pressure sensor contacts making contact. This results in the pressure sensor passing an activation signal which controls switching circuitry in the control module that removes a ground connection on the signal conductor of the measurement probe. Since the pressure sensor contacts are fixed to the semi-rigid coaxial cable and the probe housing, any continued downward pressure on the probe housing transfers the forces to the pressure sensor and the coaxial probe assembly as represented in FIG. 1 by the vertical force line. The excess forces on the pressure sensor and the coaxial probe assembly may result in damage to the pressure sensor or the coaxial probe assembly.

Another example of a signal acquisition probe for TDR applications is the CP400-04, manufactured by Candox System of Japan. This probe has a metal housing in which an insulated signal conductor is disposed. The metal housing has a threaded connector at one end for connecting a signal cable. The other end of the housing has apertures for receiving spring action pogo pins. One pogo pin is coupled to the insulated signal conductor and the other pogo pins are connected to the metal housing. Non-conductive stops are placed on the end of the housing with the pogo pins to limit the travel of the movable contacts to prevent damage to the pogo pins. Assuming that the retractable portion of the pogo pin is pre-loaded, the force on the retractable portion of the pogo pins is similar to that of FIG. 1. The pre-loaded retractable portion has an initial force $F_1$. Downward pressure on the metal housing creates an increasing force on the retractable portion of the pogo pin as represented by line $k_1$. As lone as the probe is vertical to the DUT the electrical characteristic of signal line and the ground lines are the same. If the probe is not normal to the DUT, the one or more of the pogo pins will not be retracted to the same extent as the other and the electrical characteristic of the signal or ground lines will change leading to inaccurate measurements. Further, this probe does not have EOS/ESD protection.

U.S. Pat. No. 6,704,670 describes a wideband measurement probe for single ended and differential active probing of devices under test. The measurement probe includes at least a first typically cylindrical probe barrel. The probe barrel is constructed of an electrically conductive material and extends partially outside of a probe unit housing. A probe barrel nose cone is attached to the exposed probe barrel. The probe nose cone is generally conical in form and made of an insulating material. The longitudinal axis of the probe barrel nose cone extends from the probe barrel at an offset angle from the longitudinal axis of the probe barrel. A typically cylindrical shaped probe tip extends partially out of the end of the probe barrel nose cone and is make of an electrically conductive material. A probe cable having an outer shielding conductor and a central signal conductor is connected to the probe barrel and the probe tip with the outer shielding conductor being connected to the probe barrel and the signal conductor being connected to the probe tip. An elastic compressible element engages the probe barrel and the probe unit housing allowing movement of the probe barrel into and out of the probe unit housing. For a single ended measurement probe, a retractable ground tip is attached to the probe barrel. For a differential measurement probe, two probe barrel and probe nose cone assemblies are positioned side by side in a probe unit housing. Individual elastic compressible elements are provided for each assembly. Individual coaxial cables are attached to each assembly.

The forces exerted on the probe barrel and probe nose cone assemblies are comparable to forces shown in FIG. 1. Assuming that the elastic compressible element or elements are pre-loaded, there in an initial force on the assembly or assemblies as represented by the force $F_1$. Downward force on the probe unit housing exerts an increasing force on the assembly or assemblies until the elastic compressible element or elements are completely compressed or the assembly or assemblies engage a fixed stop as represented by the sloping line $k_1$. Continued downward pressure on the probe unit housing transfers forces to the assembly or assemblies as represented by the vertical force line. The above described measurement probe is used for measuring signal from a device under test. As such, the probe has passive input circuitry that lessens the need for EOS/ESD protection. Therefore, these probes do not ground the signal input to discharge electrostatic voltages on the device under test.

What is needed is a measurement probe having EOS/ESD protection capabilities. The measurement probe needs to discharge static voltages on a device under test prior to the signal channel of the measurement probe being coupled to a sampling head. Further, the measurement probe should provide an indication to a user that adequate pressure has been applied to the probe so as to prevent damage to the probe.

SUMMARY OF THE INVENTION

Accordingly, the present invention is a measurement probe having a coaxial probe assembly with a probing tip. The coaxial probe assembly is received in a housing with the probing tip extending from one end of the housing. In the preferred embodiment, the coaxial probe assembly is formed of a semi-rigid coaxial cable having a probing tip at one end and a threaded connector at the other end.

A first compressible element is disposed within the housing with the first compressible element engaging the coaxial probe assembly and applying a first pre-loaded compressive force to the coaxial probe assembly and a first increasing compressive force by axial movement of the housing relative to the coaxial probe assembly. In the preferred embodiment, the first compressible element is a compression spring positioned on the semi-rigid coaxial cable of the coaxial probe assembly with one end fixedly positioned to the semi-rigid coaxial cable and the other end engaging the housing. The compression spring is compressed between the fixed position on the semi-rigid coaxial cable and the housing to generate the first pre-loaded compressive forces.

A pressure sensor is disposed in the housing for passing an activation signal in response to the axial movement of the housing relative to the coaxial probe assembly. The pressure sensor has a first portion associated with coaxial probe assembly and a second portion associated with the housing. In the preferred embodiment, the pressure sensor has a first electrically conductive contact positioned on an outer shielding conductor the semi-rigid coaxial cable of coaxial probe assembly and a second electrically conductive contact disposed in the housing. The first electrically conductive contact is electrically coupled to the outer shielding conductor of the semi-rigid coaxial cable.

A second compressible element is disposed within the housing with the second compressible element applying a second pre-loaded compressive force to the coaxial probe assembly subsequent to the application of the first increasing compressive force on the coaxial probe assembly and a second increasing compressive force by further axial movement of the housing relative to the coaxial probe assembly.

The housing preferably has first and second members with at least one member having a channel formed therein. The first and second members are joined together to form an internal cavity for receiving the coaxial probe assembly, the first compressible element, the second compressible element and the pressure sensor.

In one embodiment of the measurement probe, the first electrically conductive contact of the pressure sensor is fixedly positioned to the outer shielding conductor of the semi-rigid coaxial cable of the coaxial probe assembly. In this embodiment, the second compressible element is a compression spring disposed within a bore of an electrically conductive housing having a movable electrical contact secured within the bore. The compression spring of the second compressible element is compressed between the electrically conductive housing and the movable electrical contact to generate the second pre-loaded compressive force.

In a further embodiment of the measurement probe, the second compressible elements is an elastomeric material disposed in the housing. The elastomeric material has the second electrically conductive contact of the pressure sensor disposed adjacent to it. The second electrically conductive contact of the pressure sensor applies a compressive force on the elastomeric material to generate the second pre-loaded compressive force.

In still a further embodiment of the measurement probe, the first electrically conductive contact of the pressure sensor is movable along the outer shielding conductor of the semi-rigid coaxial cable of the coaxial probe assembly. In this embodiment, the second compressible element is a second compression spring positioned on the semi-rigid coaxial cable of coaxial probe assembly. One end of the second compression spring is fixedly positioned to the semi-rigid coaxial cable and the other end abuts the first electrically conductive contact of the pressure sensor. The first electrically conductive contact engage a spring stop on the semi-rigid coaxial cable with the second compression springs being compressed between the fixed position and the first electrically conductive contact of the pressure sensor on the semi-rigid coaxial cable to generate the second pre-loaded compressive force. The second electrically conductive contact of the pressure sensor is then fixedly positioned in the housing.

In the preferred embodiment, the coaxial probe assembly further have an attachment plate disposed on the semi-rigid coaxial cable adjacent to the threaded connector. The attachment plate is secured to an anti-rotation block which is positioned within the housing. A bracket having a top plate and depending sidewalls is secured to the attachment plate. An electrical connector receptacle is mounted on the bracket and is electrically coupled the pressure sensor by and electrical conductor.

A measurement probe is preferably coupled via a coaxial cable to an electrical over stress and electrostatic discharge protection control module. The measurement probe passes the activation signal to the electrical over stress and electrostatic discharge protection control module for electrically coupling the probing tip of the measurement probe to input circuitry of the measurement test instrument. The second electrically conductive contact of the pressure sensor is coupled to the electrical over stress and electrostatic discharge protection control module via the electrical conductor. The probing tip of the coaxial probe assembly is coupled to electrical ground via the electrical over stress and electrostatic discharge protection control module prior to the first electrically conductive contact of the pressure sensor engaging the second electrically conductive contact of the pressure sensor. The probing tip of the coaxial probe assembly is coupled to the input circuitry of the measurement test instrument when the electrical over stress and electrostatic discharge protection control module receives the activation signal passed by the pressure sensor in response to the first electrically conductive contact of the pressure sensor engaging the second electrically conductive contact of the pressure sensor.

The electrical conductor coupling the second electrically conductive contact of the pressure sensor to the electrical over stress and electrostatic discharge protection control module preferably has first and second insulated wire segments. The first insulated wire segment electrically couples the second electrically conductive contact of the pressure sensor to an electrical contact of the electrical connector receptacle mounted on the differential measurement probe. The second insulated wire segment electrically couples an electrical contact of a first electrical plug to an electrical contact of a second electrical plug with the first electrical plug mating with the electrical connector receptacle mounted on the measurement probe and the second electrical plug mating with an electrical connector receptacle having a first electrical contact mounted in the electrical over stress and electrostatic discharge protection control module.

The objects, advantages and novel features of the present invention are apparent from the following detailed description when read in conjunction with appended claims and attached drawings.

DETAILED DESCRIPTION OF THE PREFERRED EMBODIMENT

Figure 1:
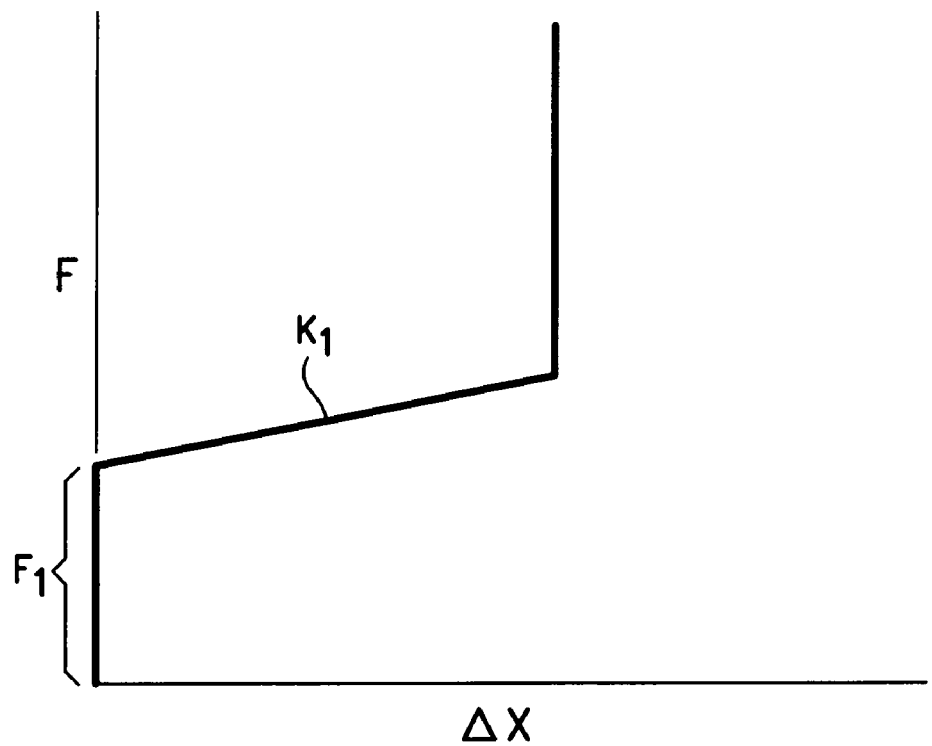
FIG. 1 is a graphical representation of the forces applied to a probing tip for an existing probe assembly.
Figure 2:
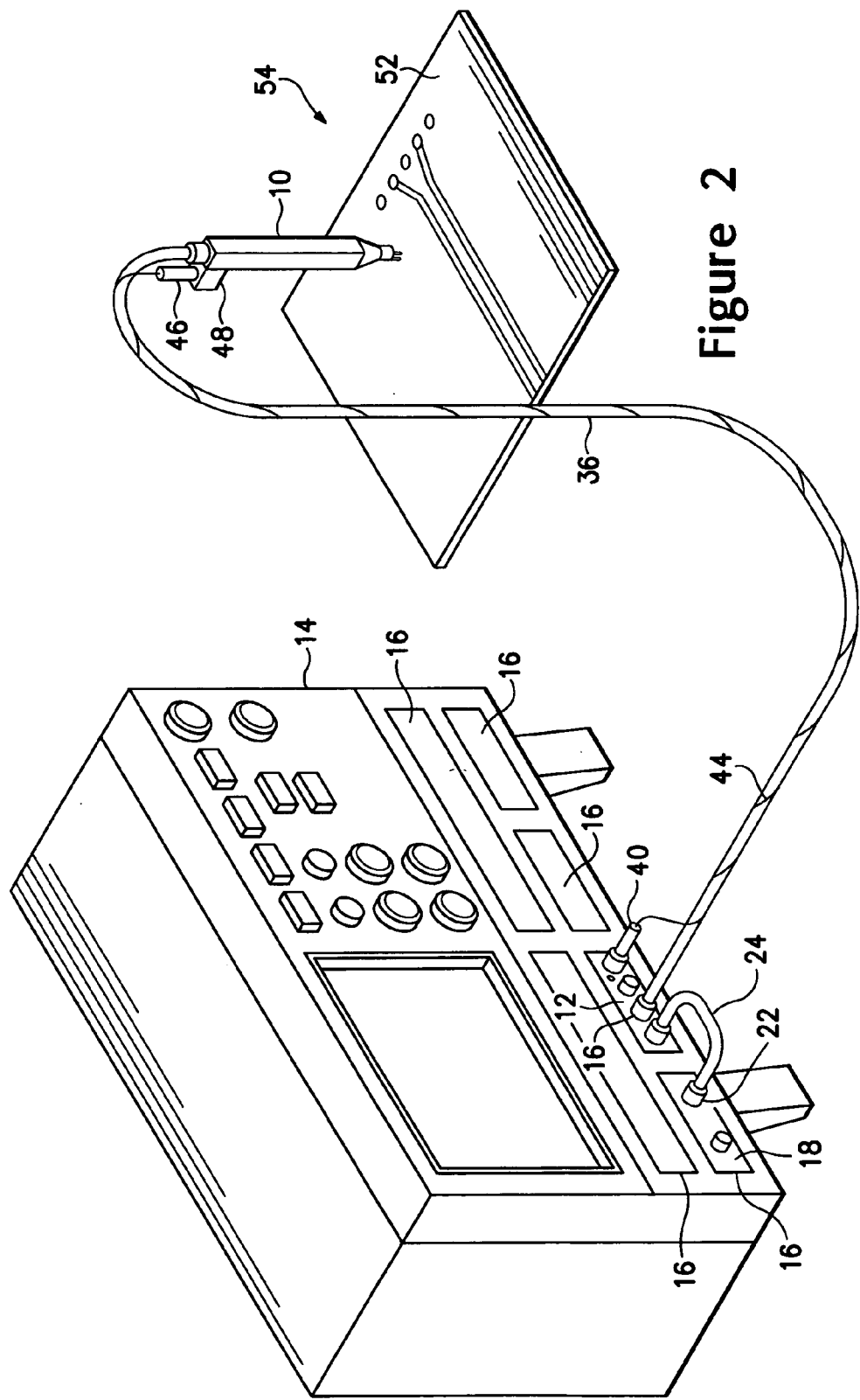
FIG. 2 is a perspective view of a measurement probe for passing an activation signal to an EOS/ESD protection control module according to the present invention.

Referring to FIG. 2, there is shown a representative view of a measurement probe 10 for passing an activation signal to an electrical over stress (EOS) and electrostatic discharge (ESD) protection control module 12. The control module 12 is disposed in a measurement test instrument 14, preferably a sampling oscilloscope, such as the TDS82000 Digital Sampling Oscilloscope, manufactured and sold by Tektronix, Inc., Beaverton, Oreg. The digital sampling oscilloscope 14 has a modular architecture that includes multiple bays 16 for receiving various types of optical and electrical plug-in modules 18. The bays 16 provide power, control signals and signal output for the modules. One such module is the 80E04 TDR Sampling Head that is usable for making TDR measurements. The sampling head 18 has an input terminal 22 coupled to sampling diodes which are terminated in 50 ohms with low parasitic capacitance. The input terminal 22 is coupled via a coaxial cable 24 to the control module 12 inserted into one of the bays 16 of the oscilloscope 14.

Figure 3:
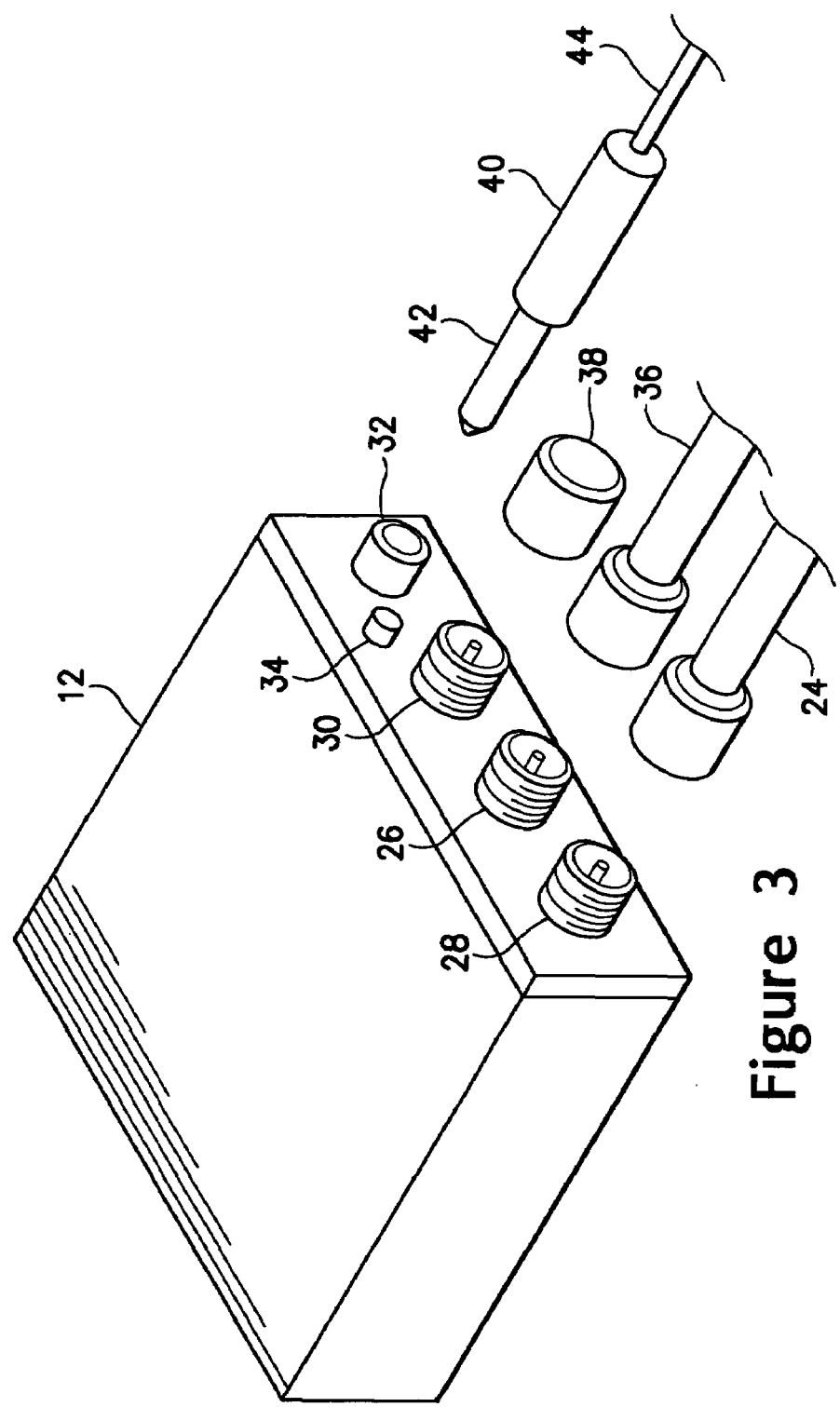
FIG. 3 is a perspective view of the EOS/ESD protection control module coupled to the measurement probe for passing an activation signal according to the present invention.

The control module 12 is best shown in the perspective view of FIG. 3. The control module 12 has a coaxial input terminal 26, a coaxial output terminal 28, and a coaxial termination terminal 30. An electrically conductive input connector 32 is also provided in the control module. An optional visual indicator 34, such as an LED may be secured to the control module 12 to indicate when the probing tip of the measurement probe 10 is coupled to the sampling head 18. The coaxial input terminal 26 is coupled to one end of a coaxial cable 36 whose other end is coupled to the measurement probe 10. The coaxial output terminal 28 is coupled by the coaxial cable 24 to the input terminal 22 of the sampling head 18. A 50 ohm termination connector 38 is secured to the coaxial termination terminal 30. An electrically conductive plug connector 40 plugs into the input connector 32. The electrical contact 42 of the plug connector 40 is electrically connected to an electrical conductor 44 having a second plug connector 46 at the other end. The second plug connector 46 is plugged into a plug receptacle 48 mounted on the measurement probe 10. The measurement probe 10 is used to probe circuit traces 50 and devices mounted on a circuit board 52 of a device under test 54. The circuit board 52 illustrates tradition G-S-G-S-G contacts with the traces 50 flaring out to the contacts.

Figure 4:
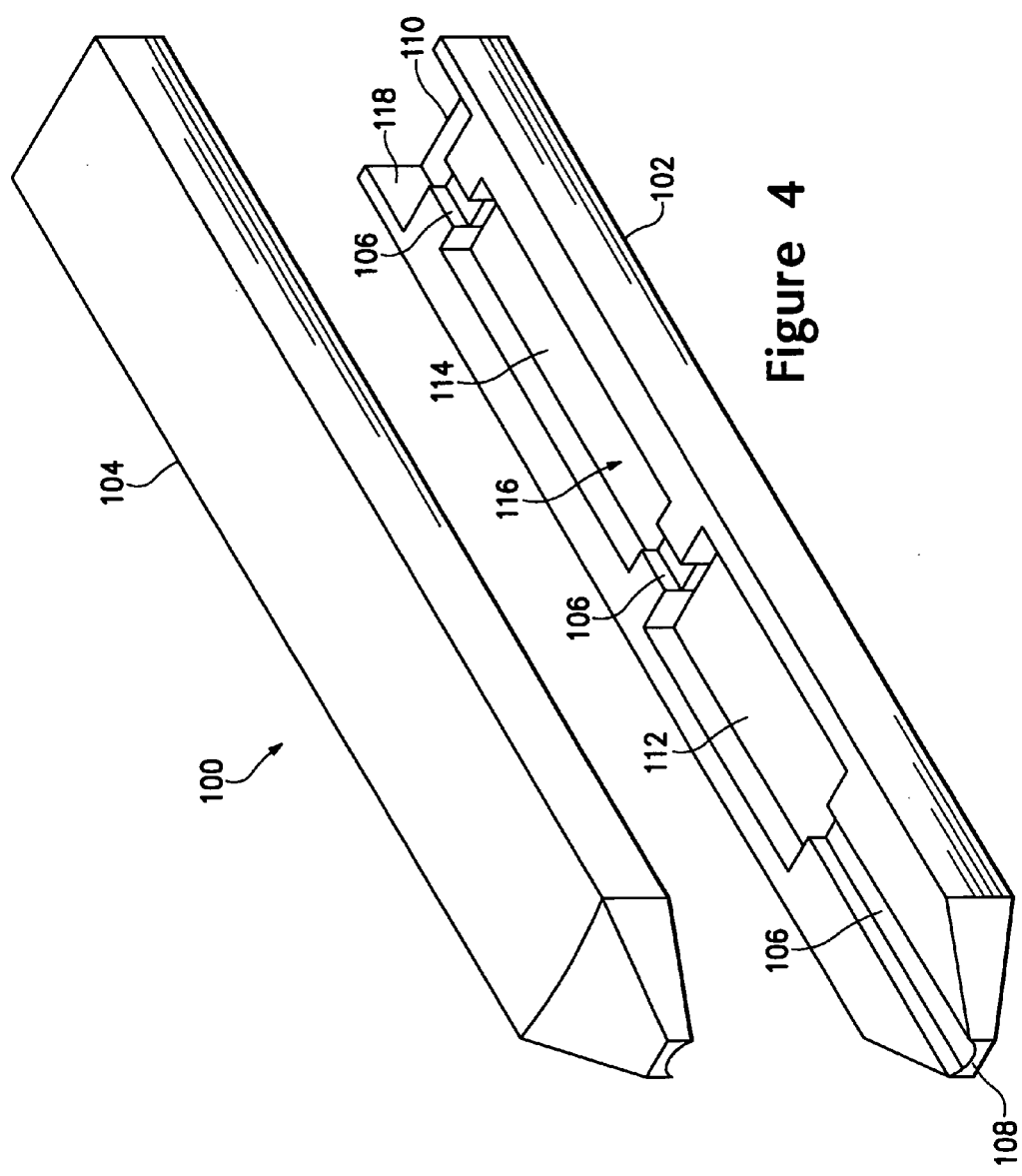
FIG. 4 is a exploded perspective view of the housing for the measurement probe for passing an activation signal to an EOS/ESD protection control module according to the present invention.

Referring to FIG. 4, there is shown a exploded view of a housing 100 for a first embodiment of the differential measurement probe 10 for passing an activation signal to the EOS/ESD protection control module 12. The housing 100 is preferably elongate with a rectangular cross-section and made of first and second member 102, 104. The housing 100 is formed of an insulating material, such as ABS plastic, polycarbonate, or the like. At least one of the housing members 102 has a channel 106 that is exposed at each end 108, 110 of the housing member 102. Preferably the channel 106 is formed parallel to the longitudinal axis of the housing member 102. Recesses 112, 114 are formed in the housing member 102 that extend laterally from the channel 106. The channel 106 and recesses 112, 114 form an interior cavity 116 within the housing 100 when the first and second housing members 102 and 104 are attached to each other. The rearward end 110 of the housing has a recess 118 therein for receiving an anti-rotation block to be described in greater detail below. While the above housing 100 has been described with a channel 106 and recesses 112, 114, 118 formed in one housing member 102, the housing 100 may be formed with channels and recesses in both housing members 102, 104 that form the interior cavity 116 and recess 118 when the housing members are attached to each other.

Figure 5:
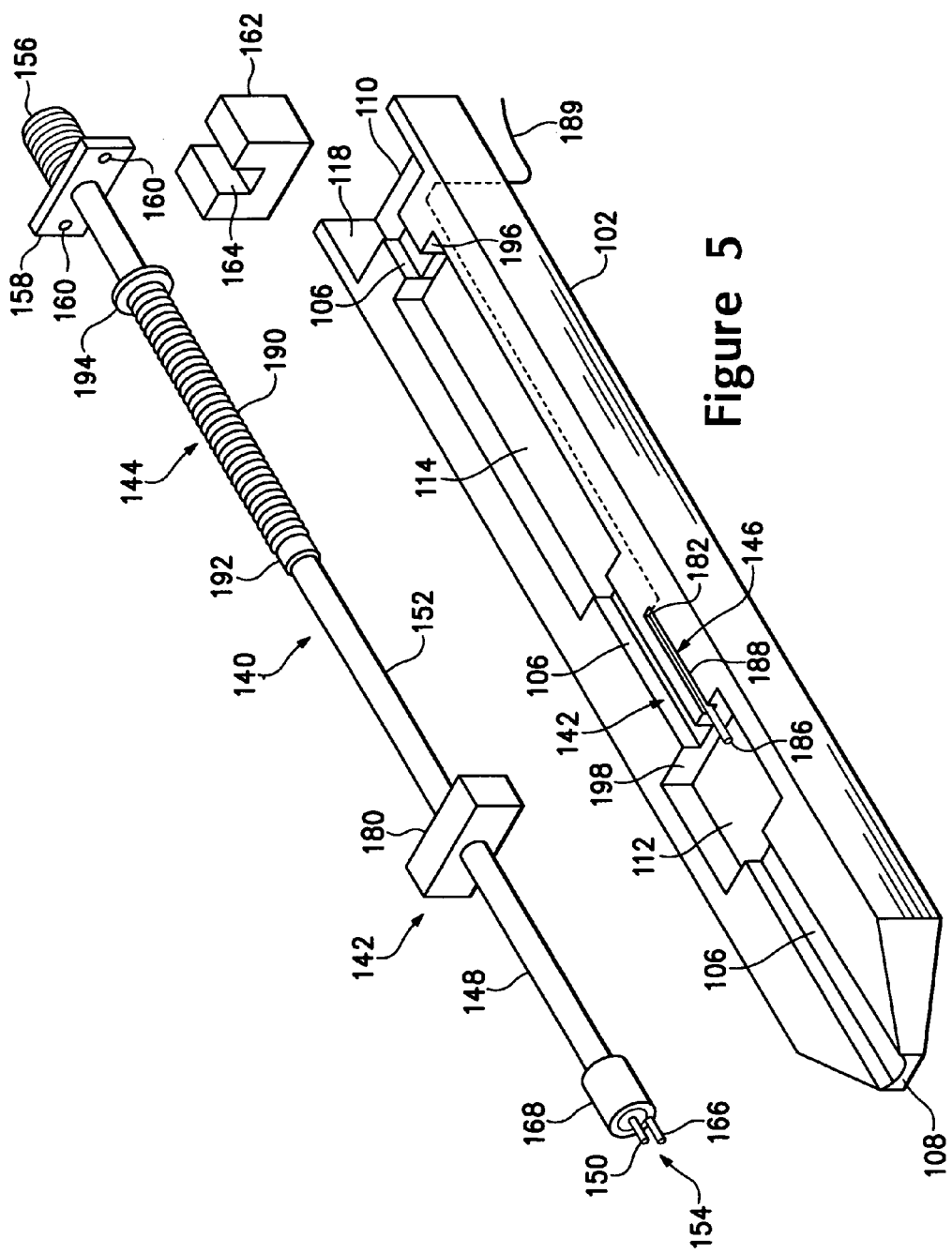
FIG. 5 is a partially exploded view of a first embodiment of the measurement probe for passing an activation signal to an EOS/ESD protection control module according to the present invention.

Referring to FIG. 5, there is shown a partial exploded view of a coaxial probe assembly 140, a pressure sensor 142 and first and second compressive elements 144, 146. The coaxial probe assembly 140 has a semi-rigid coaxial cable 148 having a central signal conductor 150 and an outer shielding conductor 152. The central signal conductor 150 extends outward past the outer shielding conductor 152 at one end to form a probing tip 154. A coaxial threaded connector 156 is attached to the other end of the semi-rigid coaxial cable 148 with the threaded portion of the connector 156 coupled to the outer shielding conductor 152 and the central signal conductor 150 coupled to a central conductor axially disposed within the coaxial threaded connector 156. An attachment plate 158 is attached to the outer shielding conductor 152 adjacent to the coaxial threaded connector 156. The attachment plate 158 is preferably rectangular in shape and had apertures 160 therein for receiving threaded screws. Abutting the attachment plate 158 on the side away from the coaxial threaded connector 156 is an anti-rotation block 162. The anti-rotation block 162 has a channel 164 formed therein that accepts the semi-rigid coaxial cable 148. The anti-rotation block 162 has threaded apertures that receive the threaded screws passing through the apertures 160 of the attachment plate 158 for securing the anti-rotation block 162 to the attachment plate 158. A ground probing tip 166 is disposed adjacent to the probing tip 154 and is electrically coupled to the outer shielding conductor 152 of the semi-rigid coaxial cable 148. In the preferred embodiment the ground probing tip 166 is a retractable, spring loaded probing tip that is attached to a slotted collar 168 that fits around outer shielding conductor 152 of the semi-rigid coaxial cable 148.

The pressure sensor 142 has a first electrically conductive contact 180 positioned on the semi-rigid coaxial cable 148. The electrically conductive contact 180 is preferably a rectangular shape having a central bore for closely receiving the semi-rigid coaxial cable 148. The first electrically conductive contact is secured to the outer shielding conductor 148 of the semi-rigid coaxial cable using solder, electrically conductive epoxy, or the like. The first electrically conductive contact 180 is preferably made of an electrically conductive material, such as copper, brass, or the like, that is plated with gold. The height and width of the first electrical contact 180 generally conforms to the height and width of the recess 112 formed in the housing member 102. The second electrically conductive contact 182 is disposed within a slot 184 formed in the housing member 102. The slot 184 is aligned parallel with the channel 106 in the housing member 102. The second electrically conductive contact 182 has a movable electrical contact 186 that is disposed within a bore of an electrically conductive housing 188. The second compressive element 146 is also disposed within the bore of the electrically conductive housing 188. The movable electrical contact 186 extends into the recess 112 for making electrical contact with the first electrically conductive contact 180. An insulated wire 189 electrically couples the electrically conductive housing 188 to the plug receptacle 48 mounted on the measurement probe 10. In the preferred embodiment, the second electrically conductive contact 182 is a pogo pin.

The first compressive element 144 is a compression spring 190 that is positioned on the semi-rigid coaxial cable 148 of the coaxial probe assembly 140. One end of the compression spring 190 is preferably held in place on the semi-rigid coaxial cable 148 by a compression spring retention member 192 secured to outer shielding conductor 152 of the semi-rigid coaxial cable 148. The compression spring retention member 192 is preferably a collar that fits over the semi-rigid coaxial cables 148. The collars are formed of a solid material, such as metal, ABS plastic, or the like. The collars are placed on the semi-rigid coaxial cables 148 and secured to the semi-rigid coaxial cables 148 with an adhesive, such as epoxy, Locktite® or the like. The other end of the compression spring 190 is free to move along the semi-rigid coaxial cable 148. A pressure plate in the form of a washer is preferably positioned adjacent to the free end of the compression spring 190 for engaging the rearward end wall 196 of the recess 114.

The second compressive element 146 is a compression spring disposed within the bore of an electrically conductive housing 188 and captured between the closed end of the bore and the movable electrical contact 186. The compression spring is partially compressed in the electrically conductive housing 188 by the movable electrical contact 186 generating a pre-loaded compressive force $F_2$ on the movable electrical contact 186 as graphically shown in FIG. 6A. An increasing axial force is required on the movable electrical contact 186 to move the electrical contact 186 into the electrically conductive housing 188 as represented by the sloping line $K_2$. The force applied to the movable electrical contact follows Hook's law of $F=K_2 \Delta X$ where $K_2$ is the spring constant and $\Delta X$ is the displacement of the spring from its initial equilibrium position.

Figure 6A:
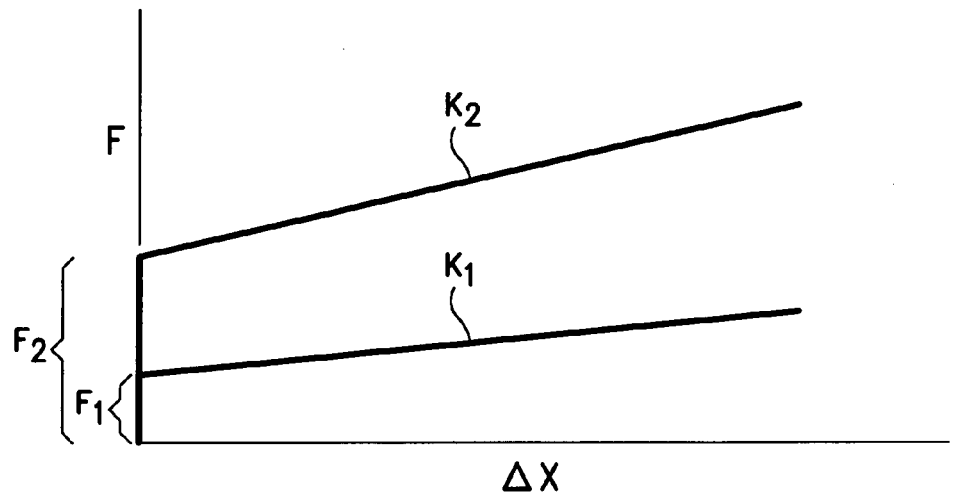
FIG. 6A is a graphical representation of the individual forces applied by the first and second compressive elements to the coaxial probe assembly in the measurement probe for passing an activation signal to an EOS/ESD protection control module according to the present invention.

The coaxial probe assembly 140 is positioned in the housing member 102 with the probing tip 152 extending out from the end 108 of the housing member 102 and the coaxial threaded connector 156 extending out from the other end 110 of the housing member 102. The compression spring 190 of the first compression element 144 is position in the recess 114 with the compression spring 190 being compressed and abutted against the rearward end wall 196 of the recess 114. The first electrically conductive contact 180 of the pressure sensor 142 is positioned in the recess 112 and the anti-rotation block is positioned in the recess 118. The initial compression of the compression spring 190 applies a pre-loaded compressive force $F_1$ on the coaxial probe assembly 140 as represented in the graph of FIG. 6A. An increasing force is required to displace the free end of the compression spring 190 as represented by the sloping line $K_1$ where $K_1$ is the spring constant of the compression spring 190 and follows Hook's law of $F=K_1 \Delta X$ where $\Delta X$ is the displacement of the spring from its initial equilibrium position.

Figure 6B:
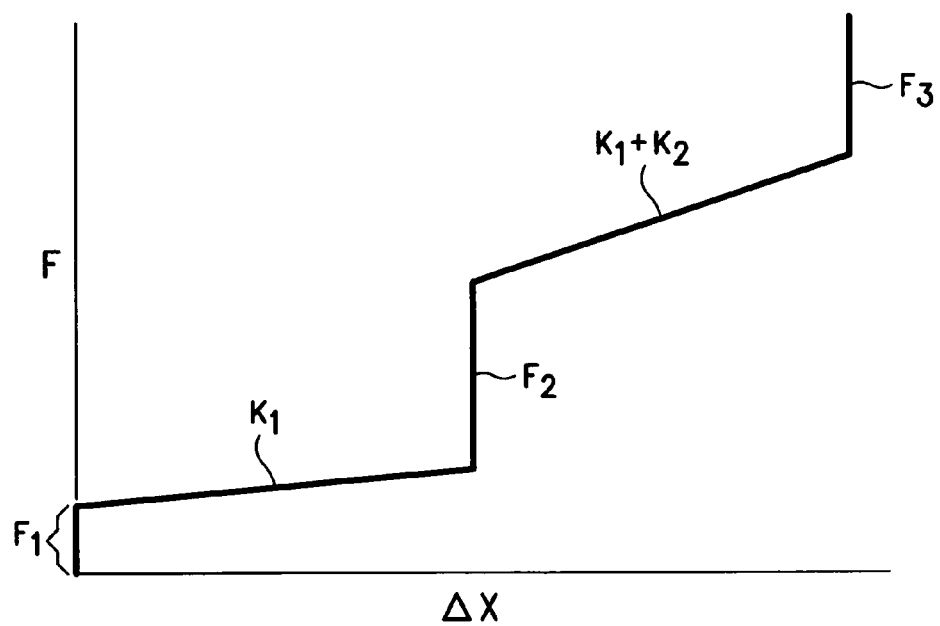
FIG. 6B is a graphical representation of the combined forces applied by the first and second compressive elements to the coaxial probe assembly in the measurement probe for passing an activation signal to an EOS/ESD protection control module according to the present invention.

The coaxial probe assembly 140 has an initial force applied to it by the pre-loaded compressive force of compression spring 190 as represented by the force $F_1$ in FIG. 6B. With the probing tip 154 positioned on the device under test 54, downward movement of the probe housing 100 relative to the coaxial probe assembly 140 causes the rearward end wall 196 of the recess 114 to compress the compression spring 190 as represented by the sloping line $K_1$. The force applied to the coaxial probe assembly 140 and correspondingly to the probing tip 154 is the combination of the pre-loaded compressive force $F_1$ plus the increasing force required by the spring constant $K_1$ of the compression spring 190.

The downward movement of the probe housing 100 causes the second electrically conductive contact 182 of the pressure sensor 142 to move toward the first electrically conductive contact 180. When the first and second electrically conductive contacts 180, 182 are brought into contact, an activation signal is passed to the plug receptacle 48 via the insulated wire 189. The activation signal is then coupled to the control module 12 via the electrical conductor 44. At the same time, the compression spring of the second compressive element 146 generates the pre-loaded compressive force $F_2$ against the first electrically conductive contact 180 of the pressure sensor 142. The pre-loaded compressive force $F_2$ generates an immediate increase in force on the coaxial probe assembly 140 as represented by the vertical force line $F_2$ extending from the $K_1$ line in FIG. 6B. This increase in force on the coaxial probe assembly 140 has a noticeable tactile feel for a user. The user feels the need to apply greater downward force on the probe housing 100 to move the probe housing relative to the coaxial probe assembly 140. Further, an increasing downward force is required to move the probe housing 100 relative to the coaxial probe assembly 140 because of the additive properties of the spring constants of the first and second compressive elements as represented by the sloping line $K_1+K_2$. Continued downward force on the probe housing 100 will cause the first electrically conductive contact 180 of the pressure sensor 142 to abut the rearward end wall 198 of the recess 112. Any continued downward pressure on the probe housing 100 transfers the force directly to the coaxial probe assembly 140 as represented by the vertical force line $F_3$ and not taken up by the compression springs.

The use of the first and second compressive elements 144 and 146 provides increased protection of the components of the coaxial probe assembly 140 as compared to previous measurement probes with movable probing tips or housings. The increase in force required to move the probe housing 100 relative to the coaxial probe assembly 140 due to the second compressive element 146 provides a user with a tactile indication that sufficient pressure is being applied to the coaxial probe assembly 140. Further, the second compressive element 146 provides a pressure safety zone where additional downward force can be applied to the probe housing 100 without running the risk of causing damage to the coaxial probe assembly 140. Such a pressure safety zone was not available with the prior art probes.

Figure 7:
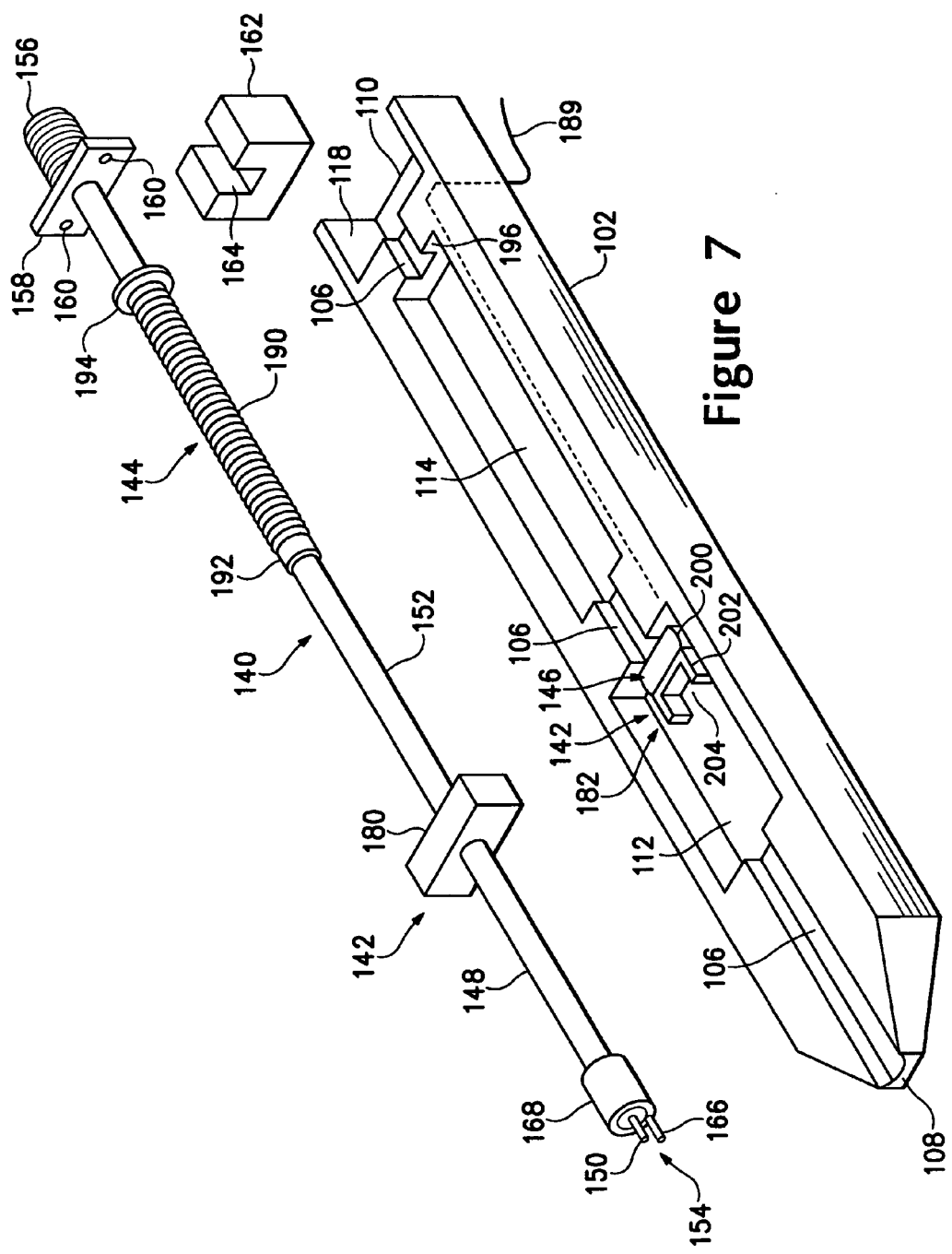
FIG. 7 is partially exploded view of a second embodiment of the measurement probe for passing an activation signal to an EOS/ESD protection control module according to the present invention.

Referring to FIG. 7, the is shown a second embodiment of the measurement probe 10. Like elements from the previous drawing figures are labeled the same in FIG. 7. In this embodiment, the second compressive element 146 is implemented with an elastomeric material 200, such as a silicon material or the like. The elastomeric material 200 is disposed adjacent to the rearward end wall 198 of the recess 112. Disposed in front of the elastomeric material 200 is the second electrically conductive contact 182 implemented as a U-shaped conductive element 202. The U-shaped conductive element 202 may be formed of an electrically conductive material, such as brass, copper or the like that is plated with a layer of gold. The base portion 204 of the U-shaped conductive element 202 has an aperture formed therein for receiving a threaded screw that passes through the elastomeric material 200 and is secured in the housing member 102. The threaded screw is tightened so that the U-shaped conductive element 202 applies a force to the elastomeric material 200 as represented by the pre-loaded compressive force $F_2$ in FIG. 6A. The elastomeric material 200 exhibits a linear response to an applied force over the range of forces of interest as represented by the line $K_2$ in FIG. 6A. An insulated wire 189 electrically couples the U-shaped conductive element 202 to the plug receptacle 48 mounted on the measurement probe 10.

The measurement probe 10 with the elastomeric material 200 for the second compressive element 146 functions similarly to the previously described operation. The compression spring 190 of the first compressive element 144 exerts a pre-loaded compressive force $F_1$ on the coaxial probe assembly 140 as represented by the force $F_1$ in FIG. 6B. Downward movement of the probe housing 100 compresses the compression spring 190 as represented by the sloping line $K_1$. As previously stated, the force applied to the coaxial probe assembly 140 and correspondingly to the probing tip 154 is the combination of the pre-loaded compressive force $F_1$ plus the increasing force required by the spring constant $K_1$ of the compression spring 190. The downward movement of the probe housing 100 causes the second electrically conductive contact 202 of the pressure sensor 142 to move toward the first electrically conductive contact 180. When the first and second electrically conductive contacts 180, 182 are brought into contact, the activation signal is passed to the plug receptacle 48 via the insulated wire 189. At the same time, the elastomeric material 200 generates the pre-loaded compressive force $F_2$ against the first electrically conductive contact 180 of the pressure sensor 142. The pre-loaded compressive force $F_2$ generates an immediate increase in force on the coaxial probe assembly 140 as represented by the vertical force line $F_2$ extending from the $K_1$ line in FIG. 6B. This increase in force on the coaxial probe assembly 140 has a noticeable tactile feel for a user. The user feels the need to apply greater downward force on the probe housing 100 to move the probe housing relative to the coaxial probe assembly 140. Further, an increasing downward force is required to move the probe housing relative to the coaxial probe assembly 140 because of the additive properties of the spring constant of the first compressive element and the elastic modulus of the elastomeric material 200 as represented by the sloping line $K_1+K_2$. Continued downward force on the probe housing 100 will further compress the elastomeric material 200 to that point where any continued downward pressure on the probe housing 100 transfers the force directly to the coaxial probe assembly as represented by the vertical force line $F_3$.

Figure 8:
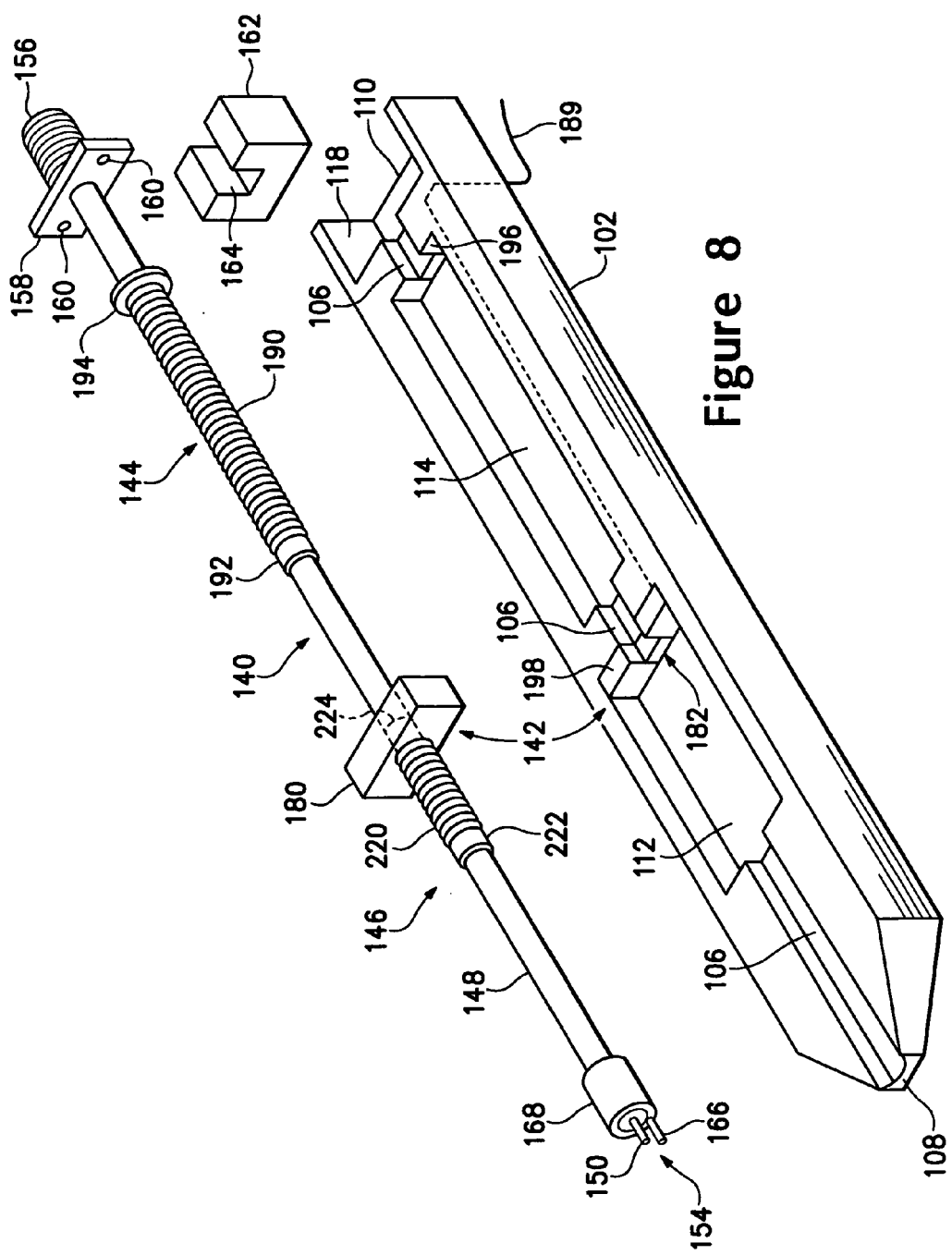
FIG. 8 is partially exploded view of a third embodiment of the measurement probe for passing an activation signal to an EOS/ESD protection control module according to the present invention.

Referring to FIG. 8, the is shown a third embodiment of the measurement probe 10. Like elements from the previous drawing figures are labeled the same in FIG. 8. In this embodiment, the second compressive element 146 is implemented as a compression spring 220 positioned on the semi-rigid coaxial cable 148 of the coaxial probe assembly 140. One end of the compression spring 220 is preferably held in place on the semi-rigid coaxial cable 148 by a compression spring retention member 222 secured to outer shielding conductor 152 of the semi-rigid coaxial cable 148. The compression spring retention member 222 is similar to the compression spring retainer member 192 previously described. The other end of the compression spring 220 abuts the first electrical contact 180 of the pressure sensor 142 that is positioned on the semi-rigid coaxial cable 148. The first electrical contact 180 is free to move along the semi-rigid coaxial cable 148 as compared to the previous embodiments where the first electrically conductive 180 contact is fixed to the semi-rigid coaxial cable 148. The first electrical contact 180 is positioned on the semi-rigid coaxial cable 148 so as to apply a force on the compression spring 220 resulting in a pre-loaded compressive force $F_2$ as represented in FIG. 6A and FIG. 6B. A second retention member 224 is secured to the semi-rigid coaxial cable 148 to prevent the first electrical contact 180 from releasing the compressive force on the compression spring 220. An increasing force is required to move the first electrically conductive contact 180 along the semi-rigid coaxial cable due to the spring constant of the spring 220 as represented by line $K_2$.

The second electrically conductive contact 182 of the pressure sensor 142 is formed of an electrically conductive material, such as brass, copper or the like, that is plated with a layer of gold. The electrically conductive contact 182 is configured to match the profile of the rear end wall 198 of the recess 112. An insulated wire 189 electrically couples the electrically conductive contact 182 to the plug receptacle 48 mounted on the measurement probe 10.

The forces applied to the coaxial probe assembly 140 by the first and second compressive elements 144, 146 are similar to the forces applied by the embodiment of FIG. 5. The compression spring 190 of the first compressive element 144 exerts a pre-loaded compressive force $F_1$ on the coaxial probe assembly 140 as represented by the force $F_1$ in FIG. 6B. Downward movement of the probe housing 100 compresses the compression spring 190 as represented by the sloping line $K_1$. As previously stated, the force applied to the coaxial probe assembly 140 and correspondingly to the probing tip 154 is the combination of the pre-loaded compressive force $F_1$ plus the increasing force required by the spring constant $K_1$ of the compression spring 190. The downward movement of the probe housing 100 causes the second electrically conductive contact 182 of the pressure sensor 142 to move toward the first electrically conductive contact 180. When the first and second electrically conductive contacts 180, 182 are brought into contact, the activation signal is passed to the plug receptacle 48 via the insulated wire 189. At the same time, the compression spring 220 generates the pre-loaded compressive force $F_2$ against the second electrically conductive contact 182 of the pressure sensor 142. The pre-loaded compressive force $F_2$ generates an immediate increase in force on the coaxial probe assembly 140 as represented by the vertical force line $F_2$ extending from the $K_1$ line in FIG. 6B. This increase in force on the coaxial probe assembly 140 has a noticeable tactile feel for a user. The user feels the need to apply greater downward force on the probe housing 100 to move the probe housing relative to the coaxial probe assembly 140. Further, an increasing downward force is required to move the probe housing relative to the coaxial probe assembly 140 because of the additive properties of the spring constants of the compression springs 190, 220 as represented by the sloping line $K_1+K_2$. Continued downward force on the probe housing 100 will cause the first electrically conductive contact 180 to move along the semi-rigid coaxial cable 148 as a result of the pressure applied by the second electrically conductive contact 182. Continued downward force on the probe housing 100 will eventually cause the second electrically conductive element 182 to apply sufficient force on the first electrically conductive element 180 to completely compress the compression spring 220. Any continued downward pressure on the probe housing 100 transfers the force directly to the coaxial probe assembly 140 as represented by the vertical force line $F_3$ and not taken up by the compression springs.

Figure 9:
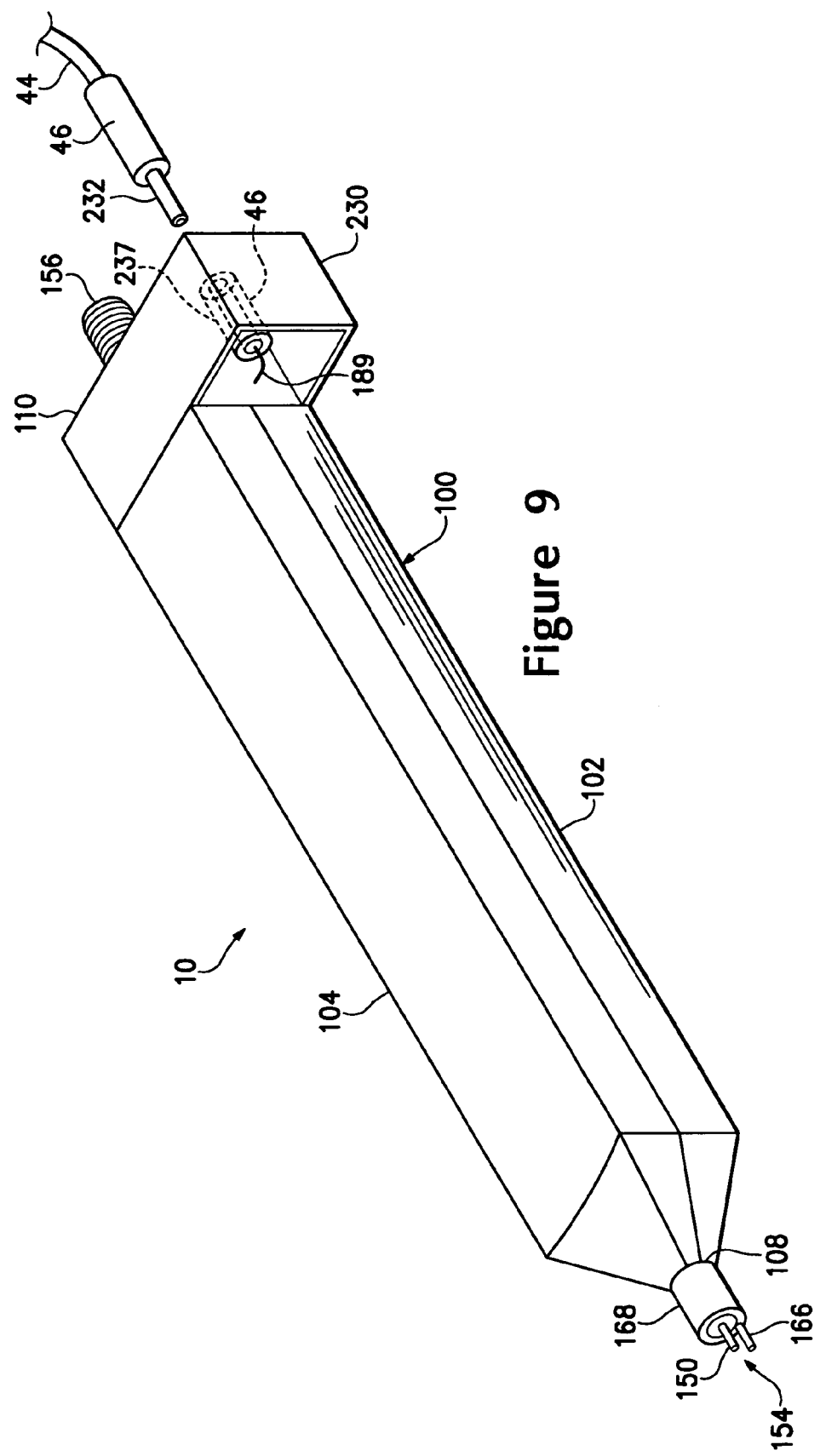
FIG. 9 is a perspective view of an assembled measurement probe for passing an activation signal to an EOS/ESD protection control module according to the present invention.

Referring to FIG. 9, there is shown an assembled measurement probe 10. The first and second housing members 102, 104 are secured together to captures the coaxial probe assembly 140 within the hosing 100 with the probing tip 154 extending out of end 108 and the coaxial threaded connector 156 extending out of end 110. Positioned over the end 110 of the housing 100 is a bracket 230 that is attached to the anti-rotation block 162 using threaded screws. Mounted on the bracket is the plug receptacle 48 having an electrical contact 231 that mates with an electrical contact 232 of the second plug connector 46 of the electrical conductor 44. The insulated wire 189 that electrically coupled to the second electrically conductive contact 182 of the pressure sensor is electrically connected to the plug receptacle 48 for coupling the activation signal to the control module 12.

Figure 10:
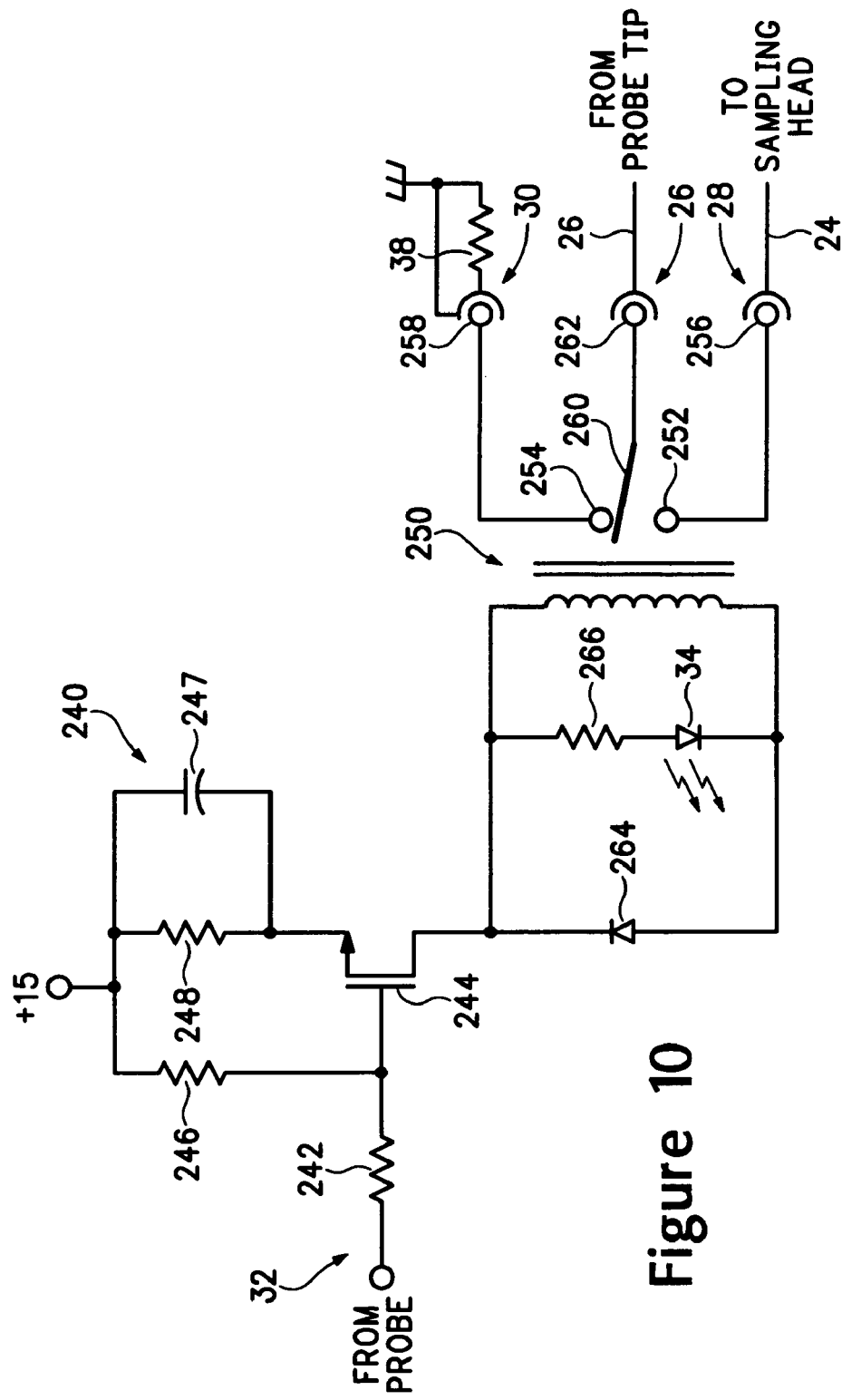
FIG. 10 is a schematic representation of the control circuitry in the control module coupled to the measurement probe for passing an activation signal to an EOS/ESD protection control module according to the present invention.

Referring to FIG. 10, there is shown a schematic representation of control circuitry 240 in the control module 12 that provides EOS/ESD protection to the sampling head 18 of the measurement test instrument 10. The electrically conductive input connector 32 receives the activation signal from the measurement probe 10 via the electrical contact 42 of the plug connector 40 connected to the electrical conductor 44. The activation signal from the measurement probe 10 is coupled through resistor 242 to the control terminal of a high input impedance transconductance device 244. In the preferred embodiment, the high input impedance transconductance device 244 is a p-channel MOS field effect transistor, such as manufactured and sold by Tektronix, Inc. under Part No. 151-1120-00. Alternately, the high input impedance transconductance device 244 may be a CMOS logic gate controlling a power circuit. A bias resistor 246 is coupled between the control terminal of the high input impedance transconductance device 244 and a voltage supply. The voltage supply is also supplied to the current output of the high input impedance transconductance device 244 through power supply resistor 248 and charging capacitor 247. The output of the high input impedance transconductance device 244 is coupled through a RF relay switch 250. Relay switch contacts 252 and 254 are respectively coupled to the signal conductors 256 and 258 of the coaxial output terminal 28 and a coaxial termination terminal 30. The armature contact 260 is coupled to the signal conductor 262 of the coaxial input terminal 26. A shunt diode 264 is coupled in parallel with the RF relay switch 250. A series connected resistor 266 and light emitting diode used as the optional visual indicator 34 may be coupled in parallel with the RF relay switch 250.

The operation of the measurement probe 10 will be described with a p-channel MOSFET as the high input impedance transconductance device 244. The spring loaded coaxial probe assembly 140 of the measurement probe 10 is coupled to the coaxial input terminal 26 of the control module 12 via coaxial cable 36. The central signal conductor 150 of the semi-rigid coaxial cable 148 is coupled to the signal conductor 262 of the coaxial input terminal 26 and the outer shielding conductor 108 is coupled to electrical ground through the outer shielding conductor of the coaxial cable 36 and the coaxial input terminal 26. The pressure sensor 142 is coupled to the input of the p-channel MOSFET 244 via the electrical conductor 44 and the contact 42 of the input connector 40. The pressure sensor 142 functions as a switch element for the input circuitry of the p-channel MOSFET 244. The pressure sensor 142 presents an open circuit to the gate of the p-channel MOSFET in the standby mode when the first and second electrically conductive contacts 180 and 182 are not engaged. The open circuit biases the p-channel MOSFET 244 to the off state by coupling supply voltage through the biasing resistor 246 to the gate of the MOSFET.

A user positions the measurement probe 10 is on the device under test 54 with the probing tip 154 contacting the circuit trace 50. The probing tip 154 is coupled to electrical ground through the armature and switch contacts 260 and 254 and the 50 ohm termination resistor 66 to discharge any ESD and EOS voltages on the device under test 54. Pressure applied to the probing tip 154 of the measurement probe 10 in contact with a device under test 54 causes movement of the housing 100 relative to the coaxial probe assembly 140. The movement of the housing 100 brings the second electrically conductive contact 182 of the pressure sensor 142 into contact with the first electrically conductive contact 180 of the pressure sensor 142. The engagement of the first and second electrically conductive contacts 180, 182 couples electrical ground into the input circuitry of the p-channel MOSFET 244 producing a voltage divider network that includes biasing resistor 246, input resistor 242 and the resistance of the pressure sensor 142. The voltage drop across biasing resistor 246, which in the preferred embodiment has a high resistive value of approximately 4.7 megohms, causes the p-channel MOSFET 244 to conduct and apply a pull-in current and voltage to the coil of the RF relay 250 that closes the contacts 260 and 252 and couple the probing tip 154 of the measurement probe 10 to the input of the sampling head 12. The RF relay 250 requires a 30 ma pull-in current at +15 volts to initially move the armature 260 from the normally closed contact 254 to the normally open contact 252. A smaller holding current and voltage is supplied to the RF relay 250 by the RC circuit made of charging capacitor 247 and resistor 248. The current output of the p-channel MOSFET is also coupled through resistor 266 and LED 34 to provide a visual indication that the probing tip is coupled to the input of sampling head 18.

Reducing the measurement probe 10 pressure to the device under test 54 below the second pre-loaded compressive forces produced by the second compressive element 146 disengages the electrically conductive contacts 180, 182 and of the pressure sensor 142 causing the activation signal from the measurement probe 10 to be removed from the input circuits of the p-channel MOSFETs 244 of the control module 12. Lifting the measurement probe 10 off of the device under test 54 disengages the electrically conductive contacts 180, 182 of the pressure sensor 142 causing the activation signal from the measurement probe 10 to be removed from the input circuit of the p-channel MOSFET 244. The voltage supply is reapplied to the gate of the p-channel MOSFET 244 causing the MOSFET to shut off and remove the power to the RF coil 250, which in turn couples the probing tip 154 of the measurement probe 10 to electrical ground through the 50 ohm termination resistor 66. The current from the collapsing magnetic field of the coil is coupled through shunt diode 264.

The present invention has been described with a electrical ground activation signal. The present invention may also be implemented using a positive or negative voltage activation signal if voltage power is provided to the measurement probe 10. In such a configuration, the first electrically conductive contact 180 of the pressure sensor 142 need to electrically insulated from the semi-rigid coaxial cable 148 and coupled to the voltage activation signal. Further, various configurations of the first and second compressive elements 144 and 146 have been described. Other configurations of the first and second compressive elements 144 and 146 using different compressive materials are contemplated where the first compressive element generates an initial pre-loaded and increasing compressive force on the coaxial probe assembly 140 and the second compressive element generates a second pre-loaded compressive force on the coaxial probe assembly 140 and adds an increasing compressive force on the coaxial probe assembly 140.

It will be obvious to those having skill in the art that many changes may be made to the details of the above-described embodiments of this invention without departing from the underlying principles thereof. The scope of the present invention should, therefore, be determined only by the following claims.

What is claimed is:

1. A measurement probe comprising:
   a coaxial probe assembly having a probing tip;
   a housing receiving the coaxial probe assembly with the probing tip extending from one end of the housing;
   a first compressible element disposed within the housing with of the first compressible element applying a first pre-loaded compressive force to the coaxial probe assembly and a first increasing compressive force by axial movement of the housing relative to the coaxial probe assembly;
   a second compressible element disposed within the housing with the second compressible element applying a second pre-loaded compressive force to the coaxial probe assembly subsequent to the application of the first increasing compressive force on the coaxial probe assembly and a second increasing compressive force by further axial movement of the housing relative to the coaxial probe assembly; and
   a pressure sensor disposed in the housing for passing an activation signal in response to the axial movement of the housing relative to the coaxial probe assembly with the pressure sensor having a first contact associated with the coaxial probe assembly and a second contact associated with the housing.

2. The measurement probe as recited in claim 1 wherein the coaxial probe assembly further comprise a semi-rigid coaxial cable having a probing tip at one end and a threaded connector at the other end.

3. The measurement probe as recited in claim 1 wherein the housing further comprises first and second members with at least one member having a channel formed therein for receiving the coaxial probe assembly, the first compressible element, the second compressible element and the pressure sensor with the first and second members being joined together to form an internal cavity.

4. The measurement probe as recited in claim 2 wherein the first compressible element comprise a compression spring positioned on the semi-rigid coaxial cable of the coaxial probe assembly with one end of the compression spring fixedly positioned to the semi-rigid coaxial cable and the other end engaging the housing with the compression spring being compressed between the fixed position on the semi-rigid coaxial cable and the housing to generate the first pre-loaded compressive force.

5. The measurement probe as recited in claim 2 wherein the first contact of the pressure sensor further comprises a first electrically conductive contact positioned on an outer shielding conductor the semi-rigid coaxial cable of the coaxial probe assembly and the second contact of the pressure sensor further comprises a second electrically conductive contact disposed in the housing, with the first electrically conductive contact electrically coupled to the outer shielding conductor of the semi-rigid coaxial cable.

6. The measurement probe as recited in claim 5 wherein the first electrically conductive contact of the pressure sensor is fixedly positioned to the outer shielding conductor of the semi-rigid coaxial cable of the coaxial probe assembly.

7. The measurement probe as recited in claim 5 wherein the second compressible element comprise a compression spring disposed within a bore of an electrically conductive housing having a movable electrical contact secured within the bore with the compression spring being compressed between the electrically conductive housing and the movable electrical contact to generate the second pre-loaded compressive force.

8. The measurement probe as recited in claim 7 wherein the electrically conductive housing receiving the compression spring and securing the movable electrical contact further comprises the second electrically conductive contact of the pressure sensor.

9. The measurement probe as recited in claim 5 wherein the second compressible element comprise an elastomeric material disposed in the housing with the elastomeric material having the second electrically conductive contact of the pressure sensor being disposed adjacent thereto and applying a compressive force on the elastomeric material to generate the second pre-loaded compressive force.

10. The measurement probe as recited in claim 5 wherein the first electrically conductive contact of the pressure sensor is movable along the outer shielding conductor of the semi-rigid coaxial cable of the coaxial probe assembly.

11. The measurement probe as recited in claim 10 wherein the second compressible element comprise a second compression spring positioned on the semi-rigid coaxial cable of the coaxial probe assembly with one end of the second compression spring fixedly positioned to the semi-rigid coaxial cable and the other end abutting the first electrically conductive contact of the pressure sensor, the first electrically conductive contact engaging a spring stop on the semi-rigid coaxial cable with the second compression spring being compressed between the fixed position and the first electrically conductive contact of the pressure sensor on the semi-rigid coaxial cable to generate the second pre-loaded compressive force.

12. The measurement probe as recited in claim 11 wherein the second electrically conductive contact of the pressure sensor are fixedly positioned in the housing.

13. The measurement probe as recited in claim 2 wherein the coaxial probe assembly further comprises an attachment plate disposed on the semi-rigid coaxial cable adjacent to the threaded connector with the attachment plate secured to an anti-rotation block, the anti-rotation block being positioned within the housing.

14. The measurement probe as recited in claim 13 further comprising an electrical conductor coupled to pressure sensor.

15. The measurement probe as recited in claim 14 further comprising an electrical connector receptacle mounted on the measurement probe having an electrical contact electrically coupled to the electrical conductor.

16. The measurement probe as recited in claim 15 wherein the electrical connector receptacle is mounted on a bracket having a top plate and depending sidewalls with the bracket secured to one of the attachment plates.

17. A measurement probe coupled via a coaxial cable to an electrical over stress and electrostatic discharge protection module with the measurement probe passing an activation signal to the electrical over stress and electrostatic discharge protection module for coupling the measurement probe to input circuitry of the measurement test instrument comprising:

a coaxial probe assembly formed from a semi-rigid coaxial cable having a probing tip at one end and a threaded connector at the other end with the threaded connector being coupled to the coaxial cable;

a housing having an internal cavity extending the length of the housing and exposed at opposing ends of the housing with the coaxial probe assembly disposed within the internal cavity having the probing tip extending from one end of the housing and the threaded connector extending from the other end of the housing;

a first compressible element disposed within the housing applying a first pre-loaded compressive force to the coaxial probe assembly and a first increasing compressive force by axial movement of the housing relative to the coaxial probe assembly;

a second compressible element disposed within the housing applying a second pre-loaded compressive force to the coaxial probe assembly subsequent to the application of the first increasing compressive force with the second compressible element applying a second increasing compressive force by further axial movement of the housing relative to the coaxial probe assembly; and a pressure sensor responsive to the axial movement of the housing relative to the coaxial probe assembly having a first electrically conductive contact positioned on the semi-rigid coaxial cable and electrically coupled to an outer shielding conductor of the semi-rigid coaxial cable and a second electrically conductive contact disposed within the housing with the second electrically conductive contact coupled to the electrical over stress and electrostatic discharge protection module via an electrical conductor;

the probing tip of the coaxial probe assembly coupled to electrical ground via the electrical over stress and electrostatic discharge protection module prior to the second compressible element applying the second pre-loaded compressive force to the coaxial probe assembly with the electrical over stress and electrostatic discharge protection module responsive to an activation signal passed by the first electrically conductive contact of the pressure sensor engaging the second electrically conductive contact of the pressure sensor disposed within the housing to couple the probing tip to the input circuitry of the measurement test instrument.

18. The measurement probe as recited in claim 17 wherein the housing further comprises first and second members with at least one member having a channel formed therein for receiving the coaxial probe assembly, the first and second compressible elements and the pressure sensor with the first and second members being joined together to form the internal cavity.

19. The measurement probe as recited in claim 17 wherein the first compressible element further comprises a first compression spring positioned on the semi-rigid coaxial cable with one end of the first compression spring fixedly positioned to the semi-rigid coaxial cable and the other end engaging the housing with the first compression spring being compressed between the fixed position on the semi-rigid coaxial cable and the housing to generate the first pre-loaded compressive force.

20. The measurement probe as recited in claim 19 wherein the first electrically conductive contact of the pressure sensor is fixedly positioned to the outer shielding conductor of the semi-rigid coaxial cable.

21. The measurement probe as recited in claim 20 wherein the second compressible element further comprises a compression spring disposed within a bore of an electrically conductive housing having a movable electrical contact secured within the bore with the compression spring being compressed between the electrically conductive housing and the movable electrical contact to generate the second pre-loaded compressive force.

22. The measurement probe as recited in claim 21 wherein the electrically conductive housing receiving the compression spring and securing the movable electrical contact further comprises the second electrically conductive contact of the pressure sensor.

23. The measurement probe as recited in claim 20 wherein the second compressible element further comprises elastomeric material disposed in the housing with the second electrically conductive contact of the pressure sensor being disposed adjacent to the elastomeric material and applying a compressive force on the elastomeric material to generate the second pre-loaded compressive force.

24. The measurement probe as recited in claim 19 wherein the first electrically conductive contact of the pressure sensor is movable along the outer shielding conductor of the semi-rigid coaxial cable.

25. The measurement probe as recited in claim 24 wherein the second compressible element further comprises a second compression spring positioned on the semi-rigid coaxial cable with one end of the second compression spring fixedly positioned to the semi-rigid coaxial cable and the other end electrically coupled to the first electrically conductive contact of the pressure sensor, the first electrically conductive contact of the pressure sensor engaging a spring stop on the semi-rigid coaxial cable with the second compression spring being compressed between the fixed position and the first electrically conductive contact of the pressure sensor on the semi-rigid coaxial cable to generate the second pre-loaded compressive force.

26. The measurement probe as recited in claim 25 wherein the second electrically conductive contact of the pressure sensor is fixedly positioned in the housing.

27. The measurement probe as recited in claim 17 wherein the coaxial probe assembly further comprises an attachment plate disposed on the semi-rigid coaxial cable adjacent to the threaded connector with the attachment plate secured to an anti-rotation block, the anti-rotation block being positioned within the housing.

28. The measurement probe as recited in claim 27 wherein the electrical conductor further comprises first and second insulated wire segments with the first wire segment electrically coupling the second electrically conductive contact of the pressure sensor to an electrical contact of an electrical connector receptacle mounted on the measurement probe and the second insulated wire segment electrically coupling an electrical contact of a first electrical plug to an electrical contact of a second electrical plug with the first electrical plug mating with the electrical connector receptacle mounted on the measurement probe and the second electrical plug mating with an electrical connector receptacle having at least a first electrical contact mounted in the electrical over stress and electrostatic discharge protection module.

29. The measurement probe as recited in claim 28 wherein electrical connector receptacle is mounted on a bracket having a top plate and depending sidewalls with the bracket secured to the attachment plate.

30. The measurement probe as recited in claim 17 wherein the first and second electrically conductive contacts of the pressure sensor comprises an electrical switch.

\* \* \* \* \*